US012563661B2

(12) United States Patent
Ou yang

(10) Patent No.: US 12,563,661 B2
(45) Date of Patent: Feb. 24, 2026

(54) MULTIPLEXER

(71) Applicant: ASUSTeK COMPUTER INC., Taipei (TW)

(72) Inventor: Yu Ou yang, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 106 days.

(21) Appl. No.: 18/668,277

(22) Filed: May 20, 2024

(65) Prior Publication Data
US 2025/0048536 A1 Feb. 6, 2025

(30) Foreign Application Priority Data
Aug. 2, 2023 (TW) ................................. 112128940

(51) Int. Cl.
| | |
|---|---|
| *H05K 1/02* | (2006.01) |
| *H01P 1/20* | (2006.01) |
| *H01P 7/00* | (2006.01) |
| *H05K 1/14* | (2006.01) |

(52) U.S. Cl.
CPC ............. *H05K 1/0237* (2013.01); *H01P 1/20* (2013.01); *H01P 7/00* (2013.01); *H05K 1/14* (2013.01)

(58) Field of Classification Search
CPC ............... H03F 2200/451; H03F 3/245; H03F 2200/294; H03F 3/68; H03F 1/565; H03F 2200/111; H03F 2200/165; H03F 2200/171; H03F 2203/7209; H03F 3/72; H03F 3/19; H04B 1/40; H04B 1/006; H04B 1/0057; H04B 1/04; H04B 1/52; H04B 1/0458; H04B 2001/0416; H03H 7/0115; H03H 9/542; H03H 9/706; H03H 9/725; H03H 7/38; H03H 7/46; H03H 7/463; H03H 9/70; H03H 9/0566; H03H 9/0561; H03H 9/0557; H01L 23/5383; H01L 23/66; H01L 2223/6677; H01L 2224/16225;
(Continued)

(56) References Cited

U.S. PATENT DOCUMENTS

| | | | | |
|---|---|---|---|---|
| 6,528,732 B1 * | 3/2003 | Okubora | ................. | H01L 23/66 333/204 |
| 2014/0361856 A1 * | 12/2014 | Leipold | ................ | H03H 7/0153 333/24 C |

FOREIGN PATENT DOCUMENTS

| | | |
|---|---|---|
| CN | 105680137 | 6/2016 |
| CN | 109149044 | 1/2019 |

* cited by examiner

*Primary Examiner* — Lincoln D Donovan
*Assistant Examiner* — Tyler J Pereny
(74) *Attorney, Agent, or Firm* — JCIPRNET

(57) ABSTRACT

A multiplexer includes a first circuit board, a second circuit board, and a third circuit board. The first circuit board includes a first metal layer, a first substrate layer, and a second metal layer sequentially stacked along a first direction. The second circuit board includes a third metal layer, a second substrate layer, and a fourth metal layer sequentially stacked along the first direction. The third circuit board includes a fifth metal layer, a third substrate layer, and a sixth metal layer sequentially stacked along the first direction. The second and third metal layer have same wiring structure, and the second metal layer connects to the third metal layer to form a first signal transmission path structure and a filter structure. The fourth and fifth metal layer have same wiring structure, and the fourth metal layer connects to the fifth metal layer to form a second signal transmission path structure.

10 Claims, 7 Drawing Sheets

(58) Field of Classification Search
CPC . H01L 2224/32225; H01L 2224/73204; H01L
23/3128; H01L 23/49822
See application file for complete search history.

MULTIPLEXER

CROSS-REFERENCE TO RELATED APPLICATION

This application claims the priority benefit of Taiwan application serial no. 112128940, filed on Aug. 2, 2023. The entirety of the above-mentioned patent application is hereby incorporated by reference herein and made a part of this specification.

BACKGROUND

Technical Field

The disclosure relates to a multiplexer having a stacked board structure.

Description of Related Art

The circuit structure of the traditional multiplexer has a complex signal wiring structure and needs to use a large number of through vias to transmit signals transmitted by the signal wiring of different layers. In particular, in the process of the through vias transmitting the signals, impedance mismatch or transmission interference is likely to occur, resulting in poor signal transmission quality.

SUMMARY

The disclosure provides a multiplexer. The multiplexer includes a first circuit board, a second circuit board, and a third circuit board. The first circuit board includes a first metal layer, a first substrate layer, and a second metal layer sequentially stacked along a first direction. The second circuit board includes a third metal layer, a second substrate layer, and a fourth metal layer sequentially stacked along the first direction. The third circuit board includes a fifth metal layer, a third substrate layer, and a sixth metal layer sequentially stacked along the first direction. The second metal layer and the third metal layer have the same wiring structure, and the second metal layer is connected to the third metal layer to form at least one first signal transmission path structure and at least one filter structure. The fourth metal layer and the fifth metal layer have the same wiring structure, and the fourth metal layer is connected to the fifth metal layer to form at least one second signal transmission path structure. The signal coupling between the at least one first signal transmission path structure and the at least one filter structure is performed in a non-contact manner, and the signal coupling between the at least one filter structure and the at least one second signal transmission path structure is performed in a non-contact manner.

Based on the above, the multiplexer of the disclosure can perform the signal coupling in the non-contact manner to achieve the effect of signal transmission in the circuit board.

In order to make the above-mentioned features and advantages of the disclosure more comprehensible, the embodiments are provided and described in detail as follows along with the accompanying drawings.

DESCRIPTION OF THE EMBODIMENTS

Figure 1:
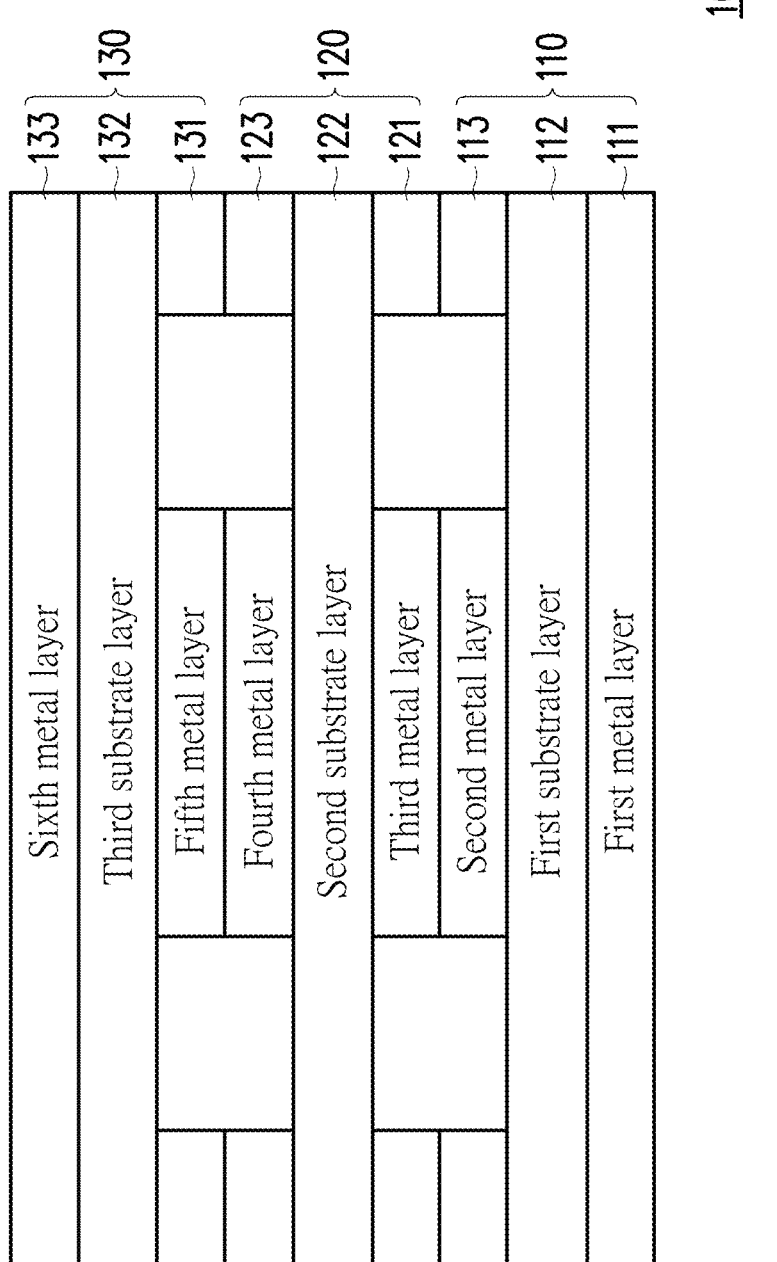
FIG. 1 is a schematic side view of a multi-layer board structure according to an embodiment of a multiplexer of the disclosure.

In order to make the content of the disclosure more comprehensible, the following embodiments are provided as examples that the disclosure can be implemented accordingly. In addition, wherever possible, elements/members/steps with the same reference numerals are used in the drawings and embodiments to represent the same or similar components.

Referring to FIG. 1, a multiplexer 100 of the disclosure may be implemented by a multi-layer board structure, and the multiplexer 100 may include a first circuit board 110, a second circuit board 120, and a third circuit board 130. In this embodiment, the first circuit board 110, the second circuit board 120, and the third circuit board 130 are stacked along a direction D1, and the wiring surfaces of the first circuit board 110, the second circuit board 120, and the third circuit board 130 are respectively parallel to planes formed by extending respectively from a direction D2 and a direction D3. The direction D1, the direction D2, and the direction D3 are perpendicular to each other. In this embodiment, the first circuit board 110, the second circuit board 120, and the third circuit board 130 may be printed circuit boards (PCBs) respectively, but the disclosure is not limited thereto.

In this embodiment, the first circuit board 110 includes a first metal layer 111, a first substrate layer 112, and a second metal layer 113 sequentially stacked along the direction D1. The second circuit board 120 includes a third metal layer 121, a second substrate layer 122, and a fourth metal layer 123 sequentially stacked along the first direction D1. The third circuit board 130 includes a fifth metal layer 131, a third substrate layer 132, and a sixth metal layer 133 sequentially stacked along the first direction D1. In this embodiment, the first metal layer 111 and the sixth metal layer 133 may be ground layers respectively. The second metal layer 113 and the third metal layer 121 may have the same wiring structure, and the second metal layer 113 is connected to the third metal layer 121 to form at least one first signal transmission path structure and at least one filter structure. The fourth metal layer 123 and the fifth metal layer 131 may have the same wiring structure, and the fourth metal layer 123 may be connected to the fifth metal layer 131 to form at least one second signal transmission path structure. In this embodiment, the signal coupling between the at least one first signal transmission path structure and the at least one filter structure is performed in a non-contact manner, and the signal coupling between the at least one filter structure and the at least one second signal transmission path structure is performed in the non-contact manner.

The specific technical means on how to realize the above-mentioned signal coupling will be described in detail in the following embodiments.

In this embodiment, the multiplexer 100 may further include at least one first transmission terminal and at least one second transmission terminal. The at least one first transmission terminal may run through the first circuit board 110, the second circuit board 120, and the third circuit board 130, and the at least one first transmission terminal may be electrically connected to the at least one first signal transmission path structure. The at least one second transmission terminal may run through the first circuit board 110, the second circuit board 120, and the third circuit board 130, and the at least one second transmission terminal may be electrically connected to the at least one second signal transmission path structure.

In this embodiment, the material of the first metal layer 111, the second metal layer 113, the third metal layer 121, the fourth metal layer 123, the fifth metal layer 131, and the sixth metal layer 133 may be Cu, but the disclosure is not limited thereto. The at least one first transmission terminal and the at least one second transmission terminal may transmit/insert a signal through a microstrip, but the disclosure is not limited thereto. In this embodiment, the first substrate layer 112, the second substrate layer 122, and the third substrate layer 132 may be insulation layers respectively. The first substrate layer 112, the second substrate layer 122, and the third substrate layer 132 may be press boards having properties of low dielectric constant and low dielectric loss, such as a commercially available PCB of model RT-5880, but the disclosure is not limited thereto.

In addition, the second metal layer 113 of the first circuit board 110 and the third metal layer 121 of the second circuit board 120 may be bonded directly, or combined through solder paste or other metal materials. The fourth metal layer 123 of the second circuit board 120 and the fifth metal layer 131 of the third circuit board 130 may be bonded directly, or combined through solder paste or other metal materials.

In addition, it should be noted that the thickness of the substrate layer of each circuit board mentioned above may be greater than the metal layer, and the thickness of the metal layer of each circuit board may be the same or different, and the disclosure is not limited thereto. FIG. 1 is merely used to represent the stack relationship between a plurality of metal layers and substrate layers of a circuit board.

Figure 2:
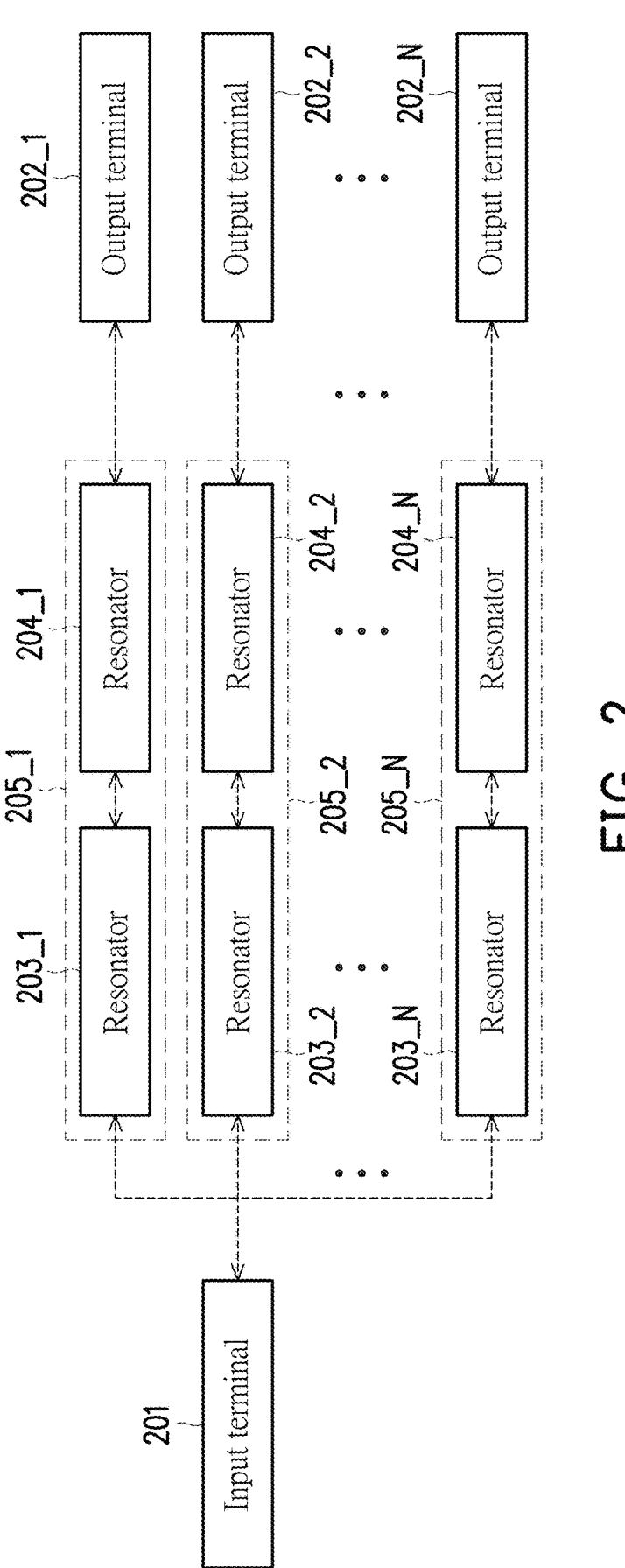
FIG. 2 is a schematic circuit view of the multiplexer according to an embodiment of the disclosure.

Referring to FIG. 1 and FIG. 2, FIG. 2 is an example embodiment of an equivalent circuit of the multiplexer of the disclosure. The multiplexer 100 in FIG. 1 may have, for example, the circuit structure of a multiplexer with one input and multiple outputs (i.e., having an input terminal and a plurality of output terminals) as shown in FIG. 2, but the disclosure is not limited thereto.

In an embodiment, the multiplexer 100 in FIG. 1 may also be a multiplexer with multiple inputs and one output (i.e., having a plurality of input terminals and an output terminal) or a multiplexer with multiple inputs and multiple outputs (i.e., having a plurality of input terminals and a plurality of output terminals). In this embodiment, the multiplexer 100 may have a (signal) input terminal 201 as shown in FIG. 2 and a plurality of (signal) output terminals 202_1, 202_2 to 202_N, in which N is a positive integer. Moreover, the multiplexer 100 may also include a plurality of resonators 203_1, 203_2 to 203_N and a plurality of resonators 204_1, 204_2 to 204_N disposed between the input terminal 201 and the plurality of output terminals 202_1, 202_2 to 202_N. The resonator 203_1 and the resonator 204_1 may form a filter 205_1. The resonator 203_2 and the resonator 204_2 may form a filter 205_2. By analogy, the resonator 203_N and the resonator 204_N may form a filter 205_N. In this embodiment, the input terminal 201 may, for example, be configured to receive communication signals of a plurality of frequency bands, and provide the communication signals of different frequency bands to the output terminals 2021, 202_2 to 202_N via the filters 205_1, 205_2 to 205_N, respectively. The communication signal may refer to a radio frequency (RF) signal, but the disclosure is not limited thereto.

In this embodiment, the multiplexer 100 may include a first transmission terminal and a plurality of second transmission terminals. The first transmission terminal and the plurality of second transmission terminals may run through the first circuit board 110, the second circuit board 120, and the third circuit board 130. The first signal transmission path structure and the filters 2051, 205_2 to 205_N may be formed in the second metal layer 113 and the third metal layer 121. The first transmission terminal may be electrically connected to the first signal transmission path structure, and may be configured as the input terminal 201. The input terminal 201 may, for example, couple the communication signals of the plurality of frequency bands to the filters 205_1, 205_2 to 205_N in a non-contact manner through a first signal transmission path structure. A plurality of second signal transmission path structures may be formed in the fourth metal layer 123 and the fifth metal layer 131. The plurality of second transmission terminals may be electrically connected to the plurality of second signal transmission path structures, and configured as the output terminals 202_1, 202_2 to 202_N. The plurality of second signal transmission path structures are configured to transmit the communication signals of different frequency bands respectively. The filters 205_1, 205_2 to 205_N may further couple the plurality of communication signals having different frequency bands to the plurality of second signal transmission path structure in a non-contact manner, so that the plurality of communication signals having different frequency bands are output from the output terminals 202_1, 202_2 to 202_N through the plurality of second signal transmission path structures. The implementation of the specific signal transmit path structure and the filter will be described in detail in the following embodiments.

Figure 3A:
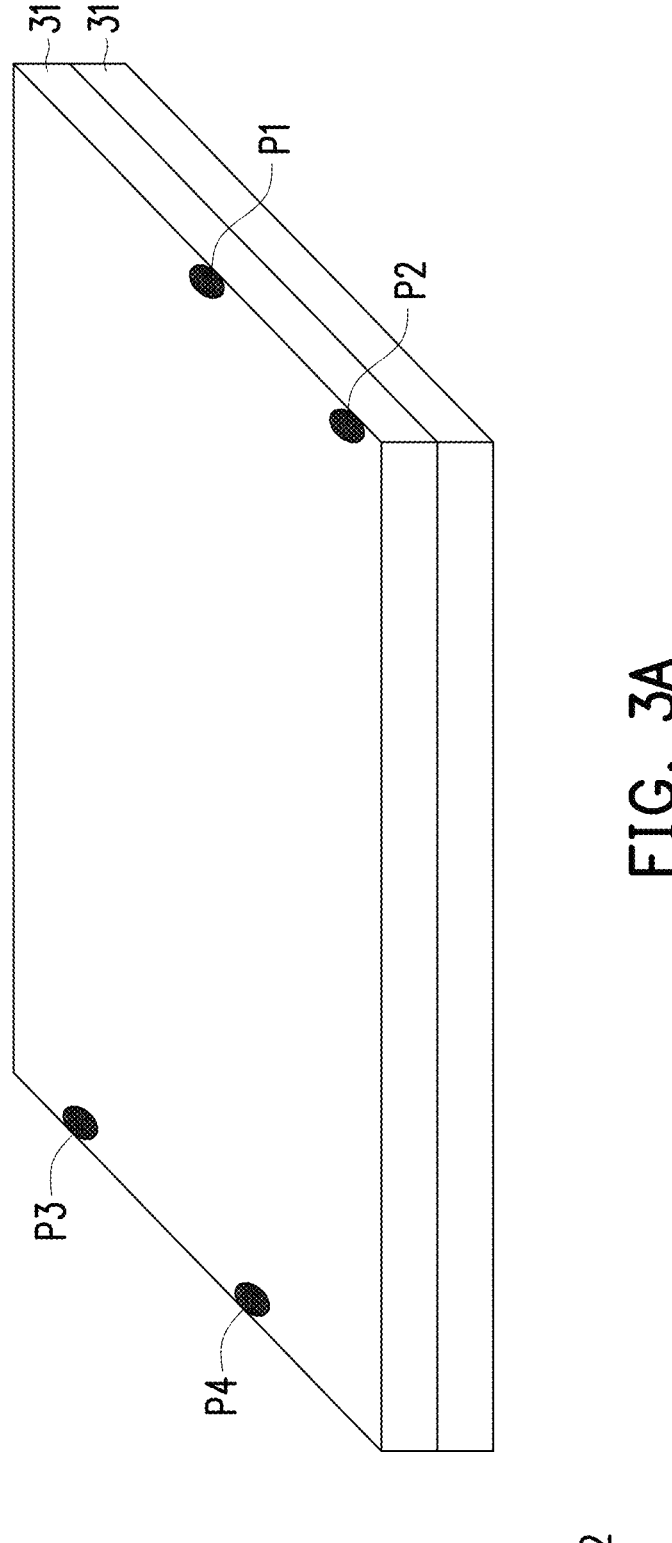
FIG. 3A is a schematic view of a first metal layer and a first substrate layer according to an embodiment of the disclosure.

FIG. 3A to FIG. 3E are example embodiments of the wiring structure of each layer of the multiplexer of the disclosure. Referring to FIG. 3A, a first substrate layer 312 may be stacked on a first metal layer 311 along the direction D1. The first metal layer 311 may cover the surface of the first substrate layer 312 and configured as a ground electrode. A side of the first metal layer 311 and the first substrate layer 312 may form a first transmission terminal P1 and a second transmission terminal P2. Another side of the first metal layer 311 and the first substrate layer 312 may form second transmission terminals P3 and P4.

Figure 3B:
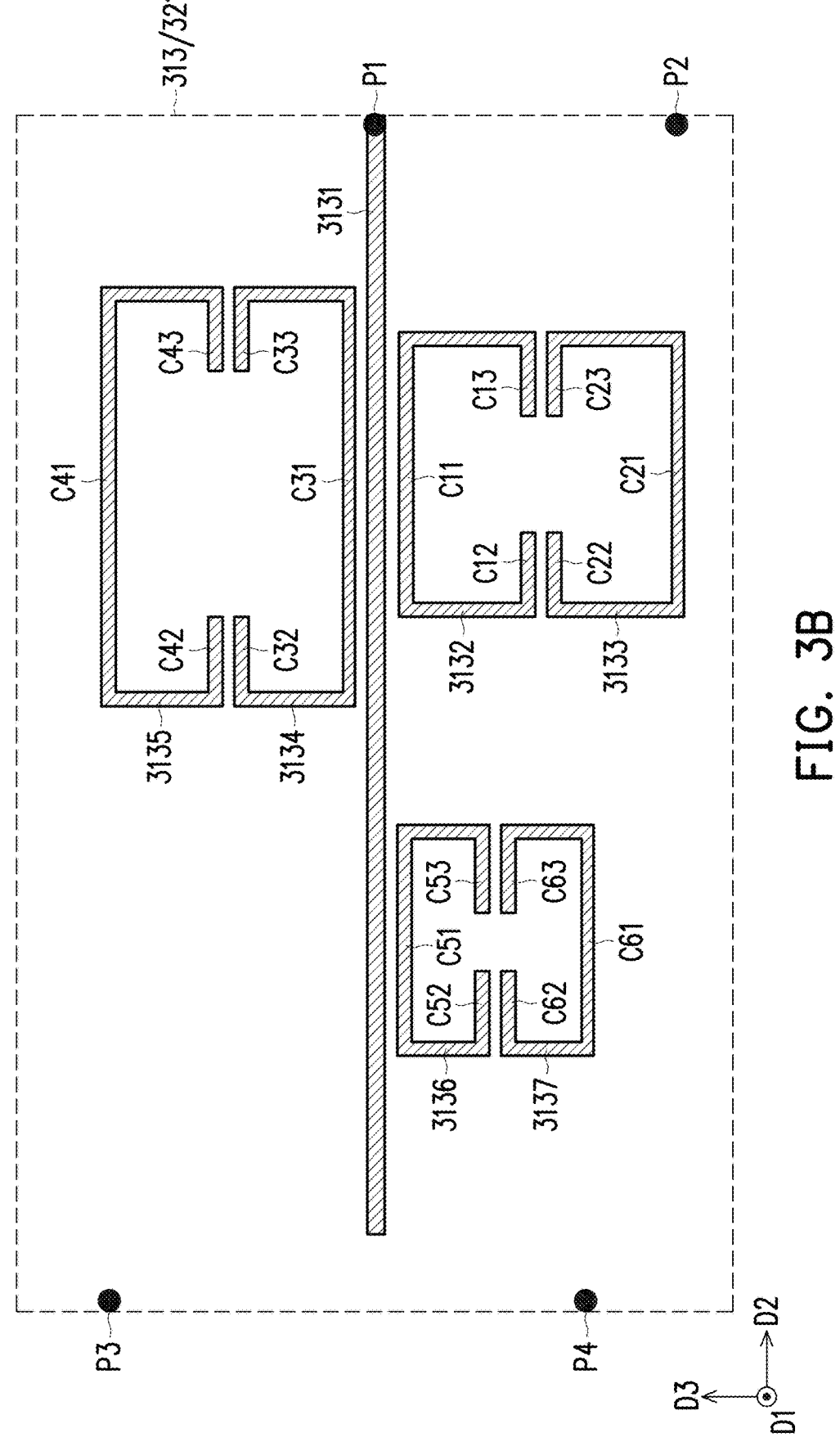
FIG. 3B is a schematic view of a second metal layer and a third metal layer according to an embodiment of the disclosure.

Referring to FIG. 3B, a second metal layer 313 and a third metal layer 321 may have the same wiring structure, in which the slashed area is a metal material (i.e., a non-hollowed out area), and the non-slashed area is a hollowed out area. The second metal layer 313 and the third metal layer 321 may form a first signal transmission path structure 3131 and a plurality of filter structure, in which the plurality of filter structures are formed by a plurality of resonators 3132 to 3137. The resonators 3132 to 3137 are symmetrical structures in pairs, in which the signal coupling between the two resonators in the pair of the symmetrical structure is performed in the non-contact manner. The resonators 3132 to 3137 may be C-type resonators with quarter wavelengths respectively, but the disclosure is not limited thereto. In other example embodiments, the resonators 3132 to 3137 may also be resonators of other types (other structure shapes).

As shown in FIG. 3B, a side of the second metal layer 313 and the third metal layer 321 may form the first transmission terminal P1 and the second transmission terminal P2. Another side of the second metal layer 313 and the third metal layer 321 may form the second transmission terminals P3 and P4. The first signal transmission path structure 3131 is electrically connected to the first transmission terminal P1. The resonator 3132 and the resonator 3133 form a filter. A section C11 of the resonator 3132 is formed on a side adjacent to the first signal transmission path structure 3131, and couples a communication signal transmitted by the first signal transmission path structure 3131 in a magnetic coupling manner of signal coupling. A section C12 and a section C13 of the resonator 3132 are formed and adjacent to a section C22 and a section C23 of the resonator 3133 respectively, and are configured to couple a communication signal of a first specific band. A section C21 of the resonator 3133 is configured to couple the communication signal having the first specific band to the second signal transmission path structure formed in the fourth metal layer and the fifth metal layer in the magnetic coupling manner of signal coupling.

The resonator 3134 and the resonator 3135 form a filter. A section C31 of the resonator 3134 is formed on another side adjacent to the first signal transmission path structure 3131, and couples the communication signal transmitted by the first signal transmission path structure 3131 in the magnetic coupling manner of signal coupling. A section C32 and a section C33 of the resonator 3134 are formed and adjacent to a section C42 and a section C43 of the resonator 3135 respectively, and are configured to couple a communication signal of a second specific band. A section C41 of the resonator 3135 is configured to couple the communication signal having the second specific band to the second signal transmission path structure formed in the fourth metal layer and the fifth metal layer in the magnetic coupling manner of signal coupling.

The resonator 3136 and the resonator 3137 form a filter. A section C51 of the resonator 3136 is formed on a side adjacent to the first signal transmission path structure 3131, and couples the communication signal transmitted by the first signal transmission path structure 3131 in the magnetic coupling manner of signal coupling. A section C52 and a section C53 of the resonator 3136 are formed and adjacent to a section C62 and a section C63 of the resonator 3137 respectively, and are configured to couple a communication signal of a third specific band. A section C61 of the resonator 3137 is configured to couple the communication signal having the third specific band to the second signal transmission path structure formed in the fourth metal layer and the fifth metal layer in the magnetic coupling manner of signal coupling.

Figure 3C:
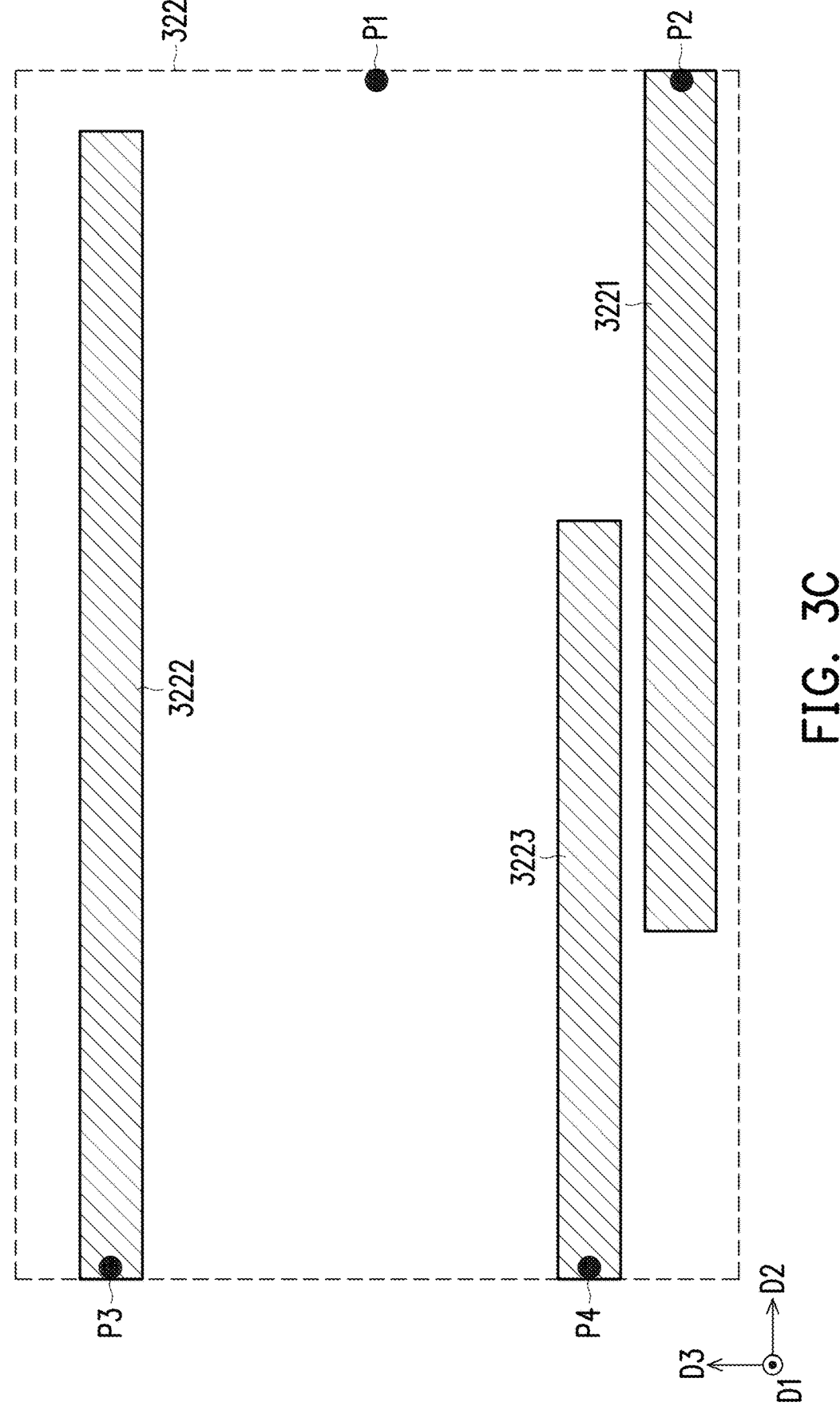
FIG. 3C is a schematic view of a second substrate layer according to an embodiment of the disclosure.

Referring to FIG. 3C, a side of a second substrate layer 322 may form the first transmission terminal P1 and the second transmission terminal P2. Another side of the second substrate layer 322 may form the second transmission terminals P3 and P4. The second substrate layer 322 includes the hollowed out area (i.e., the non-slashed area) and non-hollowed out areas (i.e., the slashed areas) 3221 to 3223, in which the non-hollowed out areas 3221 to 3223 are respectively configured along the second signal transmission path structure formed in the fourth metal layer and the fifth metal layer. In another exemplary embodiment, the second substrate layer 322 may also be a non-hollowed out area as a whole, and is not limited to as shown in FIG. 3C.

Figure 3D:
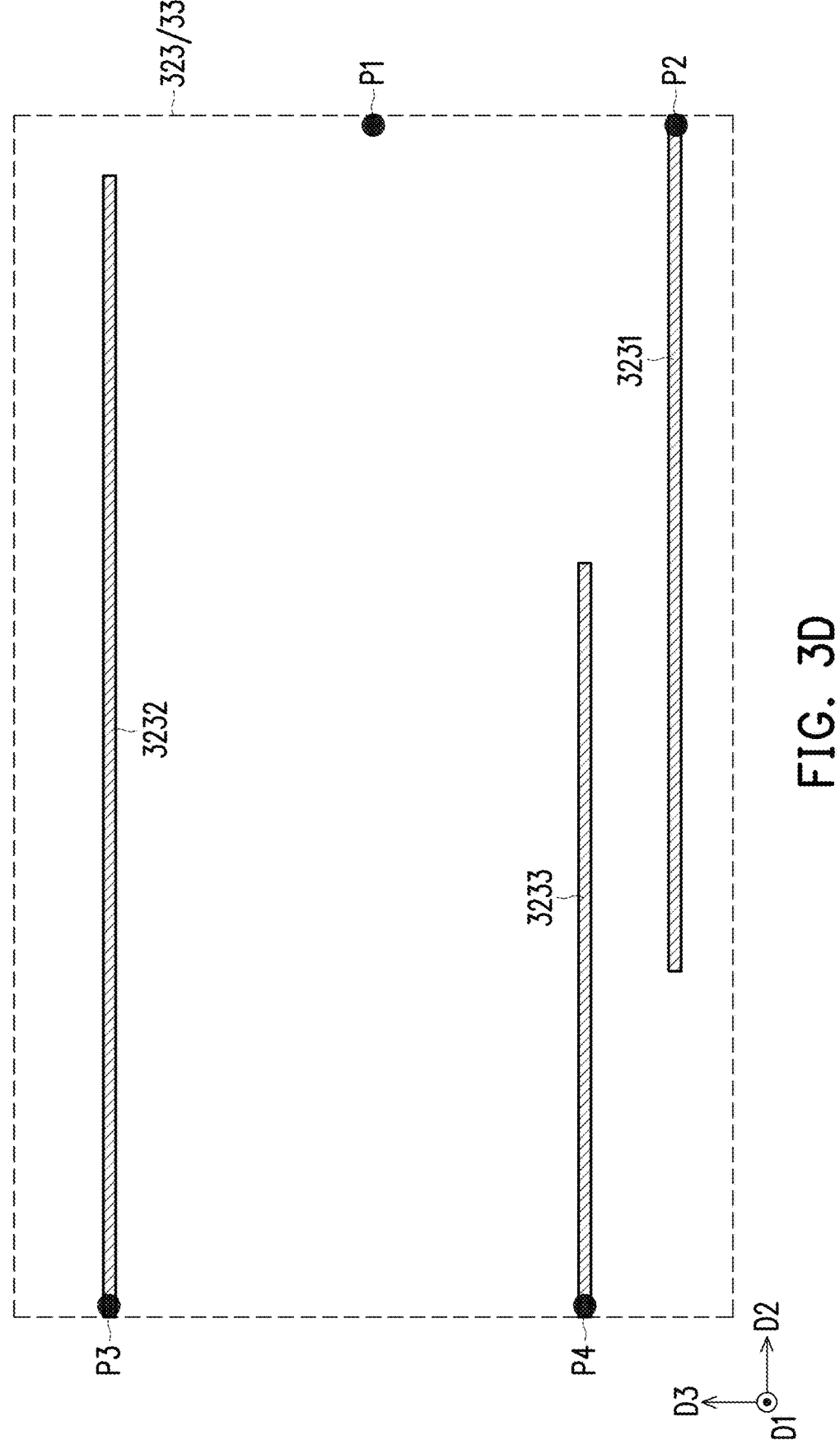
FIG. 3D is a schematic view of a fourth metal layer and a fifth metal layer according to an embodiment of the disclosure.

Referring to FIG. 3D, a fourth metal layer 323 and a fifth metal layer 331 may have the same wiring structure, in which the slashed area is a metal material (i.e., the non-hollowed out area), and the non-slashed area is a hollowed out area. The fourth metal layer 323 and the fifth metal layer 331 may form a plurality of second signal transmission path structures 3231 to 3233. It should be noted that, referring to FIG. 3B to FIG. 3D at the same time, a plurality of projection areas of the second signal transmission path structures 3231 to 3233 projected on the second substrate layer 322 along the direction D1 are respectively overlapped with the non-hollowed out areas 3221 to 3223 of the second substrate layer 322. The range of the non-hollowed out areas 3221 to 3223 may be greater than or equal to the range of the plurality of projection areas of the second signal transmission path structures 3231 to 3233 on the second substrate layer 322.

The projection area of the second signal transmission path structure 3231 projected on the second metal layer 313 and the third metal layer 321 along the direction D1 overlaps with the section C21 of the resonator 3133 formed in the second metal layer 312 and the third metal layer 321, so that the section C21 of the resonator 3133 may couple the communication signal of the first specific band to the second signal transmission path structure 3231 in the magnetic coupling manner of signal coupling. The projection area of the second signal transmission path structure 3232 projected on the second metal layer 313 and the third metal layer 321 along the direction D1 overlaps with the section C41 of the resonator 3135 formed in the second metal layer 313 and the third metal layer 321, so that the section C41 of the resonator 3135 may couple the communication signal of the second specific band to the second signal transmission path structure 3232 in the magnetic coupling manner of signal coupling. The projection area of the second signal transmission path structure 3233 projected on the second metal layer 313 and the third metal layer 321 along the direction D1 overlaps with the section C61 of the resonator 3137 formed in the second metal layer 313 and the third metal layer 321, so that the section C61 of the resonator 3137 may couple the communication signal of the third specific band to the second signal transmission path structure 3233 in the magnetic coupling manner of signal coupling.

Figure 3E:
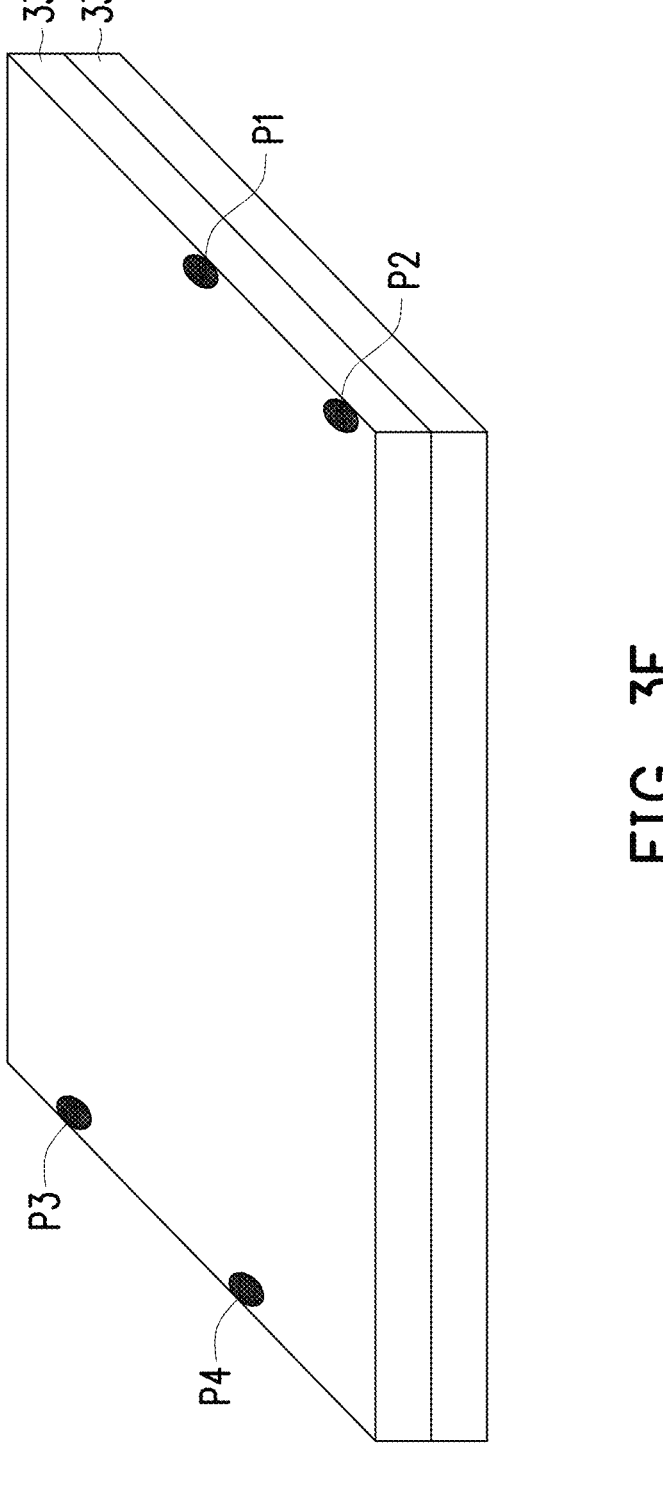
FIG. 3E is a schematic view of a third substrate layer and a sixth metal layer according to an embodiment of the disclosure.

Referring to FIG. 3E, a sixth metal layer 333 may be stacked on a third substrate layer 332 along the direction D1. The sixth metal layer 333 may cover the surface of the third substrate layer 332 and configured as a ground electrode. The sixth metal layer 333 may be formed on another surface of the third substrate layer 332 and cover the other surface of the third substrate layer 332. A side of the third substrate layer 332 and the sixth metal layer 333 may form the first transmission terminal P1 and the second transmission terminal P2. Another side of the third substrate layer 332 and the sixth metal layer 333 may form the second transmission terminals P3 and P4.

Specifically, referring to FIG. 3A to FIG. 3E at the same time, the direction D1 may be, for example, a vertical direction (i.e., the first direction described in the appended claims). The first transmission terminal P1 may be configured as a signal input terminal to receive a plurality of communication signals from a first frequency band to a third frequency band, and transmit along the first signal transmission path structure 3131 in FIG. 3B. The first signal transmission path structure 3131 in FIG. 3B may couple the plurality of communication signals from the first frequency band to the third frequency band to the section C11 of the resonator 3132, the section C31 of the resonator 3134, and the section C51 of the resonator 3136 along a horizontal direction (i.e., the second direction described in the appended claims). Next, the resonator 3132 couples the communication signals of the first frequency band to the resonator 3133. The section C21 of the resonator 3133 may couple the communication signals of the first frequency band to the second signal transmission path structure 3131 in FIG. 3D along the vertical direction. The second transmission terminal P2 may be configured as a signal output terminal to output the communication signal of the first frequency band transmitted on the second signal transmission path structure 3131. The resonator 3134 couples a communication signal of a second frequency band to the netic coupling with the plurality of filter structures along the same horizontal direction or different horizontal directions.

For example, the communication signal of the first frequency band may be, for example, the communication signal of the GPS L1 frequency band (a medium frequency band). The communication signal in the second frequency band may be, for example, the communication signal in the GPS L2 frequency band (a low frequency band). The communication signal in the third frequency band may be, for example, a communication signal in the Wi-Fi 2.4G frequency band (a high frequency band). Moreover, the disclosure can be configured to effectively transmit communication signals in the first to third frequency bands through the multiplexer of the structure design in FIG. 3A to FIG. 3E, in which the internal and external S parameters of each frequency band may be shown in Table 1 below.

TABLE 1

| | Frequency (MHz) | Maximum loss |
|---|---|---|
| Medium frequency band (GPS L1) (1547.42 MHz to 1603.42 MHz) | | |
| Insertion loss | 1547.42 MHz to 1603.42 MHz | 3.2 dB |
| Return loss | 1547.42 MHz to 1603.42 MHz | 2 dB |
| Attenuation loss | 1199.6 MHz to 1255.6 MHz | 25 dB |
| | 2402 MHz to 2484 MHz | 30 dB |
| Low frequency band (GPS L2) (1199.6 MHz to 1255.6 MHz) | | |
| Insertion loss | 1199.6 MHz to 1255.6 MHz | 3 dB |
| Return loss | 1199.6 MHz to 1255.6 MHz | 7 dB |
| Attenuation loss | 1547.42 MHz to 1603.42 MHz | 21 dB |
| | 2402 MHz to 2484 MHz | 21 dB |
| High frequency band (Wi-Fi 2.4G) (2402 MHz to 2484 MHz) | | |
| Insertion loss | 2402 MHz to 2484 MHz | 1.83 dB |
| Return loss | 2402 MHz to 2484 MHz | 7.9 dB |
| Attenuation loss | 1199.6 MHz to 1255.6 MHz | 26 dB |
| | 1547.42 MHz to 1603.42 MHz | 26 dB |
| | Signal isolation | |
| Medium frequency band and | 1547.42 MHz to 1603.42 MHz | 23 dB |
| high frequency band | 2402 MHz to 2484 MHz | 28 dB |
| Medium frequency band and | 1199.6 MHz to 1255.6 MHz | 26 dB |
| low frequency band | 1547.42 MHz to 1603.42 MHz | 23 dB |
| High frequency band and low | 1199.6 MHz to 1255.6 MHz | 35 dB |
| frequency band | 2402 MHz to 2484 MHz | 44 dB | resonator 3135. The section C41 of the resonator 3135 may couple the communication signal of the second frequency band to the second signal transmission path structure 3132 in FIG. 3D along the vertical direction. The second transmission terminal P3 may be configured as a signal output terminal to output the communication signal of the second frequency band transmitted on the second signal transmission path structure 3132. The resonator 3136 couples a communication signal of the third frequency band to the resonator 3137. The section C61 of the resonator 3137 may couple the communication signal of the third frequency band to the second signal transmission path structure 3133 in FIG. 3D along the vertical direction. The second transmission terminal P4 may be configured as a signal output terminal to output the communication signal of the third frequency band transmitted on the second signal transmission path structure 3133.

It should be noted that, in other exemplary embodiments of disclosure, the wiring manner of the first signal transmission path structure is not limited to as shown in FIG. 3B. The first signal transmission path structure may perform mag- The communication signal in the medium frequency band (GPS L1: 1547.42 MHz to 1603.42 MHz) may be input from the first transmission terminal P1 to the first signal transmission path structure 3131 in FIG. 3B, and coupled to the second signal transmission path structure 3231 in FIG. 3D via the resonators 3132 and 3133, and output via the second transmission terminal P2. As shown in Table 1 above, the communication signal in the medium frequency band (GPS L1: 1547.42 MHz to 1603.42 MHz) may have a low insertion loss and return loss, while the communication signal in the low frequency band (GPS L2: 1199.6 MHz to 1255.6 MHz) and the high frequency band (Wi-Fi 2.4G: 2402 MHz to 2484 MHz) communication signal may have a high attenuation loss.

The communication signal in the low frequency band (GPS L2: 1199.6 MHz to 1255.6 MHz) may be input from the first transmission terminal P1 to the first signal transmission path structure 3131 in FIG. 3B, and coupled to the second signal transmission path structure 3232 in FIG. 3D via the resonators 3134 and 3135, and output via the second transmission terminal P3. As shown in Table 1 above, the communication signal in the low frequency band (GPS L2: 1199.6 MHz to 1255.6 MHz) may have a low insertion loss and return loss, while the communication signal in the medium frequency band (GPS L1: 1547.42 MHz to 1603.42 MHz) and the high frequency band (Wi-Fi 2.4G: 2402 MHz to 2484 MHz) communication signal may have a high attenuation loss.

The communication signal in the high frequency band (Wi-Fi 2.4G: 2402 MHz to 2484 MHz) may be input from the first transmission terminal P1 to the first signal transmission path structure 3131 in FIG. 3B, and coupled to the second signal transmission path structure 3233 in FIG. 3D via the resonators 3136 and 3137, and output via the second transmission terminal P4. As shown in Table 1 above, the communication signal in the high frequency band (Wi-Fi 2.4G: 2402 MHz to 2484 MHz) may have a low insertion loss and return loss, while the communication signal in the low frequency band (GPS L2: 1199.6 MHz to 1255.6 MHz) and the medium frequency band (GPS L1: 1547.42 MHz to 1603.42 MHz) communication signal may have a high attenuation loss. Moreover, as shown in the above Table 1, there can be a good signal isolation between the medium frequency band and the high frequency band, between the medium frequency band and the low frequency band, and between the high frequency band and the low frequency band.

In summary, the multiplexer in the disclosure can achieve a good signal transmit quality through stacking multiple circuit boards and adopting a non-contact manner for magnetic coupling. The multiplexer of the disclosure can effectively reduce the use of through vias to transmit signals, thereby effectively reducing or avoiding the occurrence of impedance mismatch or transmission interference.

Finally, it should be noted that the above embodiments are merely used to illustrate the technical solution of disclosure, not to limit it. Although the disclosure has been described in detail with reference to the foregoing embodiments, persons skilled in the art should understand that they may still modify the technical solutions described in the foregoing embodiments, or perform equivalent replacements for the portion or all of the technical features. However, these modifications or replacements do not make the essence of the corresponding technical solutions depart from the scope of each embodiment technical solution of disclosure.

What is claimed is:

1. A multiplexer, comprising:
a first circuit board comprising a first metal layer, a first substrate layer, and a second metal layer sequentially stacked along a first direction;
a second circuit board comprising a third metal layer, a second substrate layer, and a fourth metal layer sequentially stacked along the first direction; and
a third circuit board comprising a fifth metal layer, a third substrate layer, and a sixth metal layer sequentially stacked along the first direction,
wherein the second metal layer and the third metal layer have same wiring structure, and the second metal layer is connected to the third metal layer to form at least one first signal transmission path structure and at least one filter structure,
wherein the fourth metal layer and the fifth metal layer have same wiring structure, and the fourth metal layer is connected to the fifth metal layer to form at least one second signal transmission path structure,
wherein signal coupling between the at least one first signal transmission path structure and the at least one filter structure is performed in a non-contact manner, and signal coupling between the at least one filter structure and the at least one second signal transmission path structure is performed in the non-contact manner.

2. The multiplexer as claimed in claim 1, wherein the at least one first signal transmission path structure performs magnetic coupling with the at least one filter structure along at least one second direction.

3. The multiplexer as claimed in claim 2, wherein the at least one second direction is perpendicular to the first direction.

4. The multiplexer as claimed in claim 1, further comprising:
at least one first transmission terminal running through the first circuit board, the second circuit board, and the third circuit board, wherein the at least one first transmission terminal is electrically connected to the at least one first signal transmission path structure; and
at least one second transmission terminal running through the first circuit board, the second circuit board, and the third circuit board, wherein the at least one second transmission terminal is electrically connected to the at least one second signal transmission path structure.

5. The multiplexer as claimed in claim 4, wherein the at least one first transmission terminal is configured as at least one signal input terminal, and the at least one second transmission terminal is configured as at least one signal output terminal.

6. The multiplexer as claimed in claim 1, wherein the at least one filter structure is respectively formed by two resonators, and signal coupling between the two resonators is performed in the non-contact manner.

7. The multiplexer as claimed in claim 6, wherein the two resonators are symmetrical structures, and are C-type resonators with quarter wavelengths respectively.

8. The multiplexer as claimed in claim 7, wherein the second substrate layer comprises a hollowed out area and a non-hollowed out area, and the non-hollowed out area is configured along the at least one second signal transmission path structure.

9. The multiplexer as claimed in claim 1, wherein the first metal layer and the sixth metal layer are ground layers respectively.

10. The multiplexer as claimed in claim 1, wherein a quantity of the at least one first signal transmission path structure or the at least one second signal transmission path structure is plural, and are configured to transmit communication signals of different frequency bands respectively.

* * * * *